(12) United States Patent
Gorobets et al.

(10) Patent No.: US 11,137,944 B1
(45) Date of Patent: Oct. 5, 2021

(54) COMBINED QLC PROGRAMMING METHOD

(71) Applicant: Western Digital Technologies, Inc., San Jose, CA (US)

(72) Inventors: Sergey Anatolievich Gorobets, Edinburgh (GB); Alan D. Bennett, Edinburgh (GB); Ryan R. Jones, Mesa, AZ (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/818,571

(22) Filed: Mar. 13, 2020

(51) Int. Cl.
| | |
|---|---|
| *G06F 3/00* | (2006.01) |
| *G06F 3/06* | (2006.01) |
| *G11C 11/56* | (2006.01) |
| *G11C 16/10* | (2006.01) |
| *G11C 16/04* | (2006.01) |

(52) U.S. Cl.
CPC .......... *G06F 3/0659* (2013.01); *G06F 3/0604* (2013.01); *G06F 3/0679* (2013.01); *G11C 11/56* (2013.01); *G11C 16/10* (2013.01); *G11C 16/0483* (2013.01)

(58) Field of Classification Search
CPC .... G06F 11/008; G06F 11/073; G06F 11/076; G06F 11/079; G06F 11/0793; G06F 3/0625; G06F 3/0634; G06F 3/0653; G06F 11/00; G06F 3/0611; G06F 3/0659; G06F 3/0688; G11C 11/5628; G11C 16/0483; G11C 16/12; G11C 16/28; G11C 16/32; G11C 16/3418; G11C 16/3422; G11C 16/349; G11C 16/3495; G11C 2029/5004; G11C 29/028; G11C 29/50004; G11C 29/52; G11C 29/56008; G11C 29/70
USPC .......... 711/103; 365/185.09, 185.11, 185.18, 365/185.2; 714/47.2, 6.11, 704
See application file for complete search history.

(56) References Cited

U.S. PATENT DOCUMENTS

| | | | |
|---|---|---|---|
| 9,092,340 B2 | 7/2015 | Sprouse et al. | |
| 2008/0316815 A1 | 12/2008 | Lin | |
| 2015/0003152 A1 | 1/2015 | Kwak et al. | |
| 2016/0098319 A1* | 4/2016 | Gorobets | G11C 16/10 |
| | | | 714/773 |
| 2019/0317691 A1 | 10/2019 | Kanno | |

FOREIGN PATENT DOCUMENTS

KR 20150018732 A 2/2015

* cited by examiner

*Primary Examiner* — Thong Q Le
(74) *Attorney, Agent, or Firm* — Patterson & Sheridan LLP; Steven H. Versteeg

(57) ABSTRACT

The present disclosure generally relates to improved foggy-fine programming. The data to be written initially passes through an encoder before being written to SLC. While the data is being written to SLC, the data also passes through DRAM before going through the encoder to prepare for fine writing. The data that is to be stored in SLC is in latches in the memory device and is then written to MLC as a foggy write. Thereafter, the data that has passed through the encoder is fine written to MLC. The programming occurs in a staggered fashion where the ratio of SLC:foggy:fine writing is 4:1:1. To ensure sufficient XOR context management, programming across multiple dies, as well as across multiple super-devices, is staggered so that only four XOR parity context are necessary across 64 dies.

20 Claims, 14 Drawing Sheets

| WL | STAGE | Str0 | Str1 | Str2 | Str3 |
|---|---|---|---|---|---|
| 127 | FINE | 1020 | 1021 | 1022 | 1023 |
| | FOGGY | 1012 | 1014 | 1016 | 1018 |
| 126 | FINE | 1013 | 1015 | 1017 | 1019 |
| | FOGGY | 1004 | 1006 | 1008 | 1010 |
| ... | | | | | |
| 3 | FINE | 29 | 31 | 33 | 35 |
| | FOGGY | 20 | 22 | 24 | 26 |
| 2 | FINE | 21 | 23 | 25 | 27 |
| | FOGGY | 12 | 14 | 16 | 18 |
| 1 | FINE | 13 | 15 | 17 | 19 |
| | FOGGY | 4 | 6 | 8 | 10 |
| 0 | FINE | 5 | 7 | 9 | 11 |
| | FOGGY | 0 | 1 | 2 | 3 |

FIG. 3

COMBINED QLC PROGRAMMING METHOD

BACKGROUND OF THE DISCLOSURE

Field of the Disclosure

Embodiments of the present disclosure generally relate to improving foggy-fine writing to QLC.

Description of the Related Art

Programming or writing data may require two writing phases: foggy and fine. In foggy-fine programming, the bits to be written cannot simply be written once. Rather, the data needs to be first written by foggy programming where voltage pulses are provided to push the current state to a more resolved state, but not completely resolved state. Fine programming is performed at a point in time after foggy programming to write the data again in the completely resolved state.

In foggy-fine programming, there is a four page transfer for foggy programming and a four page transfer for fine programming for a 128 KB transfer in total for a two-plane device. The foggy state is unreadable, and the data needs to be protected in case of a possible power loss event (PLI). Additionally, foggy-fine programming occurs in a staggered word line sequence, which means that data in transit is five times or eight times the programmable unit of 128 KB. To perform foggy-fine programming, multiple megabytes may be programmed multiple times. To perform the multiple programming, a large amount of data needs to be set aside in order to perform repeat programming with the exact same data.

Therefore, there is a need in the art for improved foggy-fine programming.

SUMMARY OF THE DISCLOSURE

The present disclosure generally relates to improved foggy-fine programming. The data to be written initially passes through an encoder before being written to SLC. While the data is being written to SLC, the data also passes through DRAM before going through the encoder to prepare for fine writing. The data that is to be stored in SLC is in latches in the memory device and is then written to MLC as a foggy write. Thereafter, the data that has passed through the encoder is fine written to MLC. The programming occurs in a staggered fashion where the ratio of SLC:foggy:fine writing is 4:1:1. To ensure sufficient XOR context management, programming across multiple dies, as well as across multiple super-devices, is staggered so that only four XOR parity context are necessary across 64 dies.

In one embodiment, data storage device comprises: one or more memory devices, the one or more memory devices including SLC memory and MLC memory; and a controller coupled to the one or more memory devices, the controller configured to: write data to the SLC memory; foggy write the data to MLC memory, wherein the foggy writing the data to the MLC memory includes retrieving the data from latches in the one or more memory devices and writing the retrieved data to the MLC memory; and fine writing the data to the MLC memory.

In another embodiment, a data storage device comprises: one or more memory devices, the one or more memory devices each including a plurality of dies with each die including SLC memory and MLC memory; and a controller coupled to the one or more memory devices, the controller configured to: stagger writing to the SLC memory, foggy writing to the MLC memory, and fine writing to the MLC memory, wherein a ratio of writing to the SLC memory to foggy writing to the MLC memory to fine writing to the MLC memory is 4:1:1.

In another embodiment, a data storage device comprises: one or more memory devices, wherein each memory device has a plurality of dies, wherein the plurality of dies are arranged into four strings, wherein the one or more memory devices each include SLC memory and MLC memory; a controller coupled to the one or more memory devices, the controller configured to: write data to the SLC memory of a first string on a first word line for a first set of dies; foggy write data to the MLC memory of the first string on the first word line for the first set of dies; write data to the SLC memory of a second string on the first word line for the first set of dies; foggy write data to the MLC memory of the second string on the first word line for the first set of dies; write data to the SLC memory of a third string on the first word line for the first set of dies; foggy write data to the MLC memory of the third string on the first word line for the first set of dies; write data to the SLC memory of the first string on the first word line for a second set of dies different from the first set of dies; foggy write data to the MLC memory of the first string on the first word line for the second set of dies; write data to the SLC memory of a fourth string on the first word line for the first set of dies; and foggy write data to the MLC memory of the fourth string on the first word line for the first set of dies. It is to be understood that the writing may occur in a different order than discussed above. Specifically, it is to be understood that the writing order dictates how many word lines will be in the foggy state prior to being written in the fine state.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 3 is a chart illustrating staggering foggy-fine programming.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to improved foggy-fine programming. The data to be written initially passes through an encoder before being written to SLC. While the data is being written to SLC, the data also passes through DRAM before going through the encoder to prepare for fine writing. The data that is to be stored in SLC is in latches in the memory device and is then written to MLC as a foggy write. Thereafter, the data that has passed through the encoder is fine written to MLC. The programming occurs in a staggered fashion where the ratio of SLC:foggy:fine writing is 4:1:1. To ensure sufficient XOR context management, programming across multiple dies, as well as across multiple super-devices, is staggered so that only four XOR parity context are necessary across 64 dies.

Figure 1:
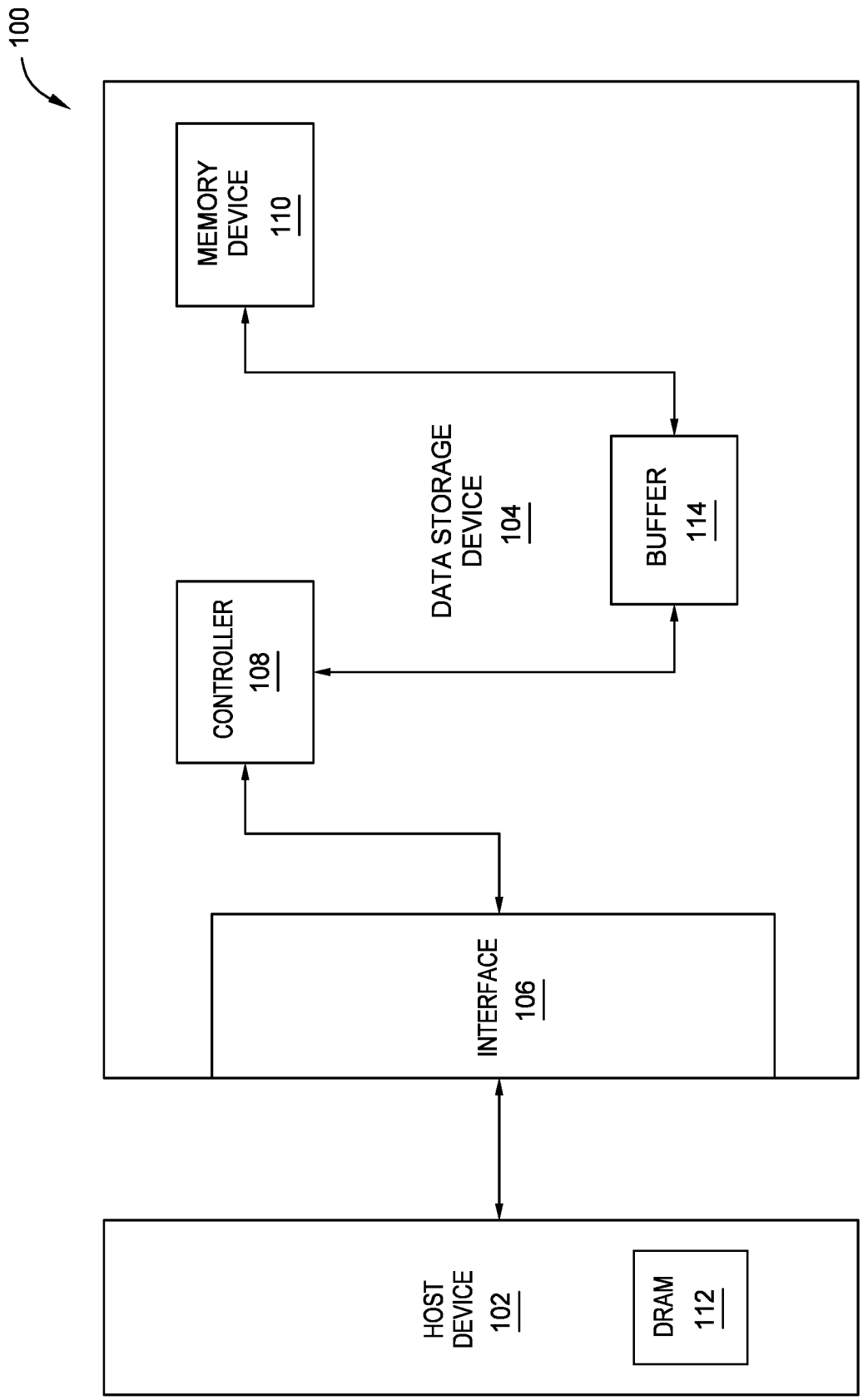
FIG. 1 is a schematic illustration of a system for storing data according to one embodiment.

FIG. 1 is a schematic illustration of a system 100 for storing data according to one embodiment. The system 100 for storing data according to one embodiment includes a host device 102 and a data storage device 104. The host device 102 includes a dynamic random-access memory (DRAM) 112. The host device 102 may include a wide range of devices, such as computer servers, network attached storage (NAS) units, desktop computers, notebook (i.e., laptop) computers, tablet computers (i.e., "smart" pad), set-top boxes, telephone handsets (i.e., "smart" phones), televisions, cameras, display devices, digital media players, video gaming consoles, video streaming devices, and automotive applications (i.e., mapping, autonomous driving). In certain embodiments, host device 102 includes any device having a processing unit or any form of hardware capable of processing data, including a general purpose processing unit, dedicated hardware (such as an application specific integrated circuit (ASIC)), configurable hardware such as a field programmable gate array (FPGA), or any other form of processing unit configured by software instructions, microcode, or firmware.

The data storage device 104 communicates with the host device 102 through an interface 106 included in the data storage device 104. The data storage device 104 includes a controller 108, a buffer 114, and one or more memory devices 110. The data storage device 104 may be an internal storage drive, such as a notebook hard drive or a desktop hard drive. Data storage device 104 may be a removable mass storage device, such as, but not limited to, a handheld, removable memory device, such as a memory card (e.g., a secure digital (SD) card, a micro secure digital (micro-SD) card, or a multimedia card (MMC)) or a universal serial bus (USB) device. Data storage device 104 may take the form of an embedded mass storage device, such as an eSD/eMMC embedded flash drive, embedded in host device 102. Data storage device 104 may also be any other type of internal storage device, removable storage device, embedded storage device, external storage device, or network storage device.

Memory device 110 may be, but is not limited to, internal or external storage units. The memory device 110 relies on a semiconductor memory chip, in which data can be stored as random-access memory (RAM), read-only memory (ROM), or other forms for RAM and ROM. RAM is utilized for temporary storage of data whereas ROM is utilized for storing data permanently.

Data storage device 104 includes a controller 108 which manages operations of data storage device 104, such as writes to or reads from memory device 110. The controller 108 executes computer-readable program code (e.g., software or firmware) executable instructions (herein referred to as "instructions") for the transfer of data. The instructions may be executed by various components of controller 108 such as processor, logic gates, switches, applications specific integrated circuits (ASICs), programmable logic controllers embedded microcontrollers, and other components of controller 108.

Data storage device 104 includes a buffer 114 which is a region of physical memory storage used to temporarily store data while the data is being moved from one place to another (i.e., from host device 102 to memory device 110).

Data may be transferred to or from the DRAM 112 of the host device 102 to the data storage device 104. One data transfer pathway may originate from the DRAM 112 of the host device 102 and communicate through the interface 106 of the data storage device 104 to the controller 108. The data will then pass through the buffer 114 of the data storage device 104 and be stored in the memory device 110. If the data is written to a SLC memory, then the data is simply written. If, however, the data is written to a MLC, such as a QLC memory, then a foggy-fine writing process occurs. It is to be noted that writing and programming may be used interchangeably throughout the disclosure. In one embodiment, the data is first written to SLC memory and then moved to MLC memory. In another embodiment, all data is written to SLC cache first and then moved to QLC for sequential or non-repetitive writes. In such a scenario, the moving of the data to QLC is scheduled by the data storage device 204 as to create free space in SLC for the following writes from the host device 102. In another embodiment, repetitive write comprises the host rewriting recently written LBAs where recently means the data is still in SLC cache. In such a scenario, three possibilities exist: move all the data, including the old obsolete LBAs to QLC and create obsolete 'holes"; move valid data only, skipping obsolete data in SLC; and if the amount of obsolete data is high, then compact SLC cache, do a garbage collection, without moving any data to QLC.

Figure 2A:
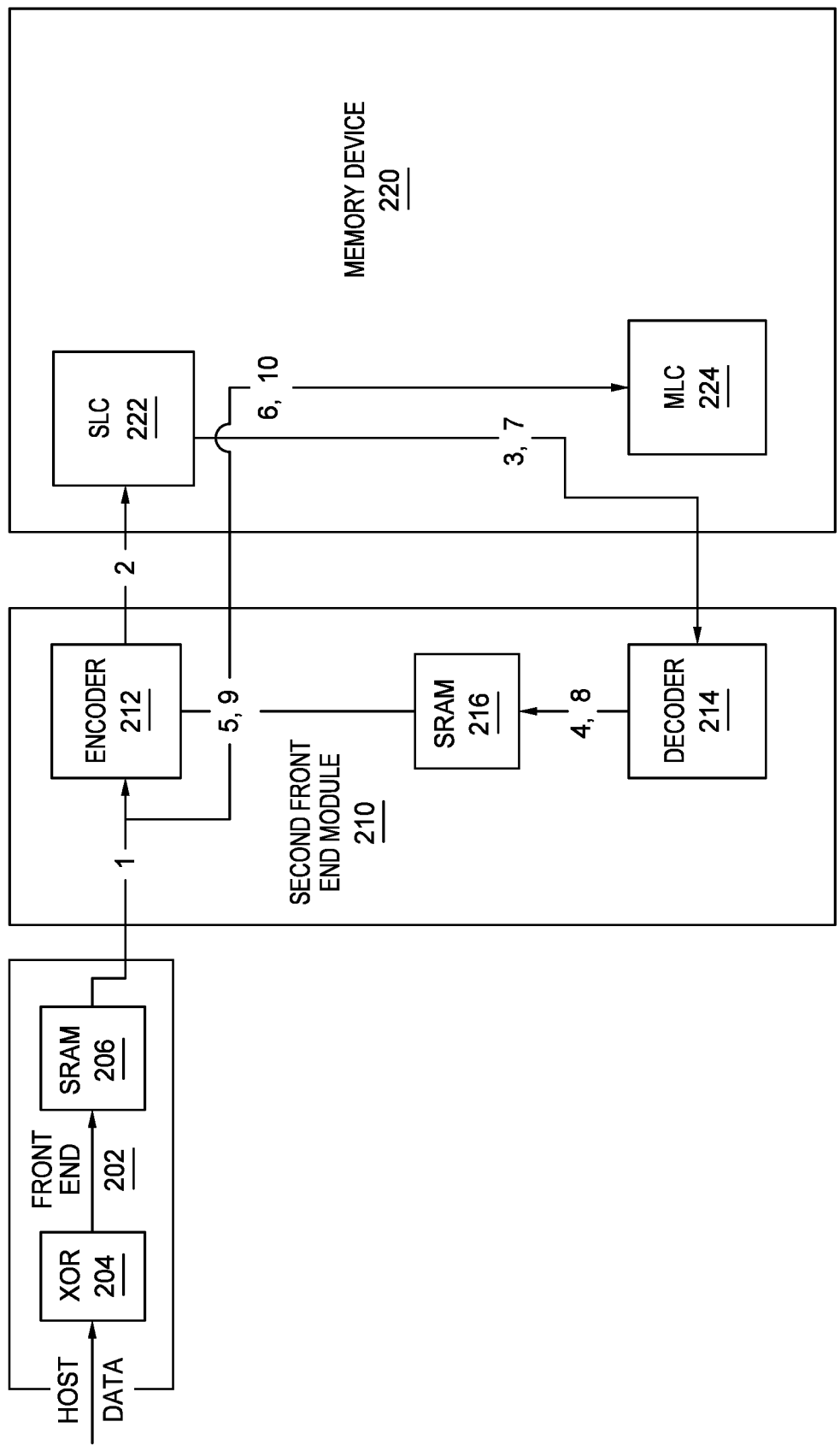
FIGS. 2A-2C are schematic illustrations of scheduling foggy-fine programming according to various embodiments.
Figure 2B:
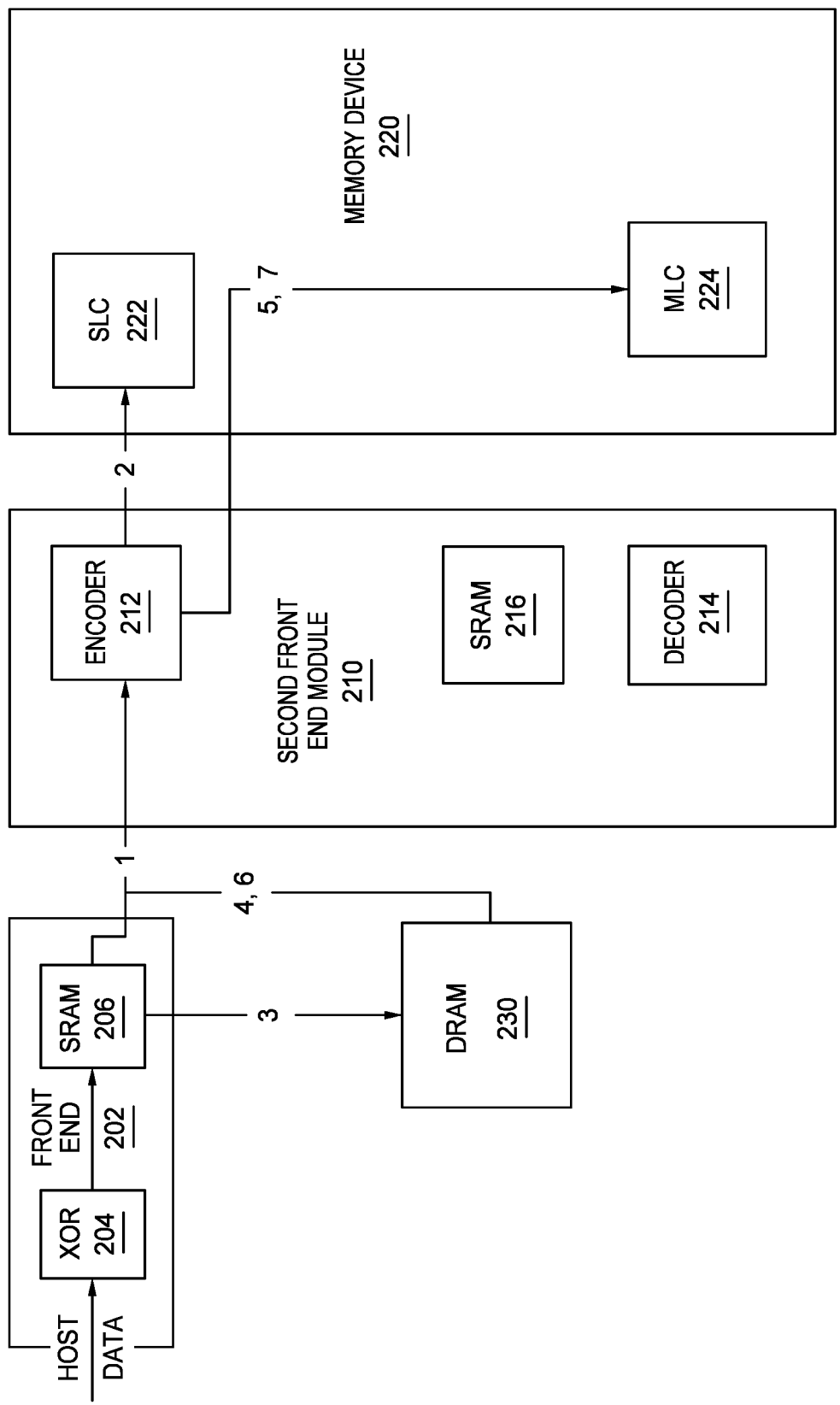
Figure 2C:
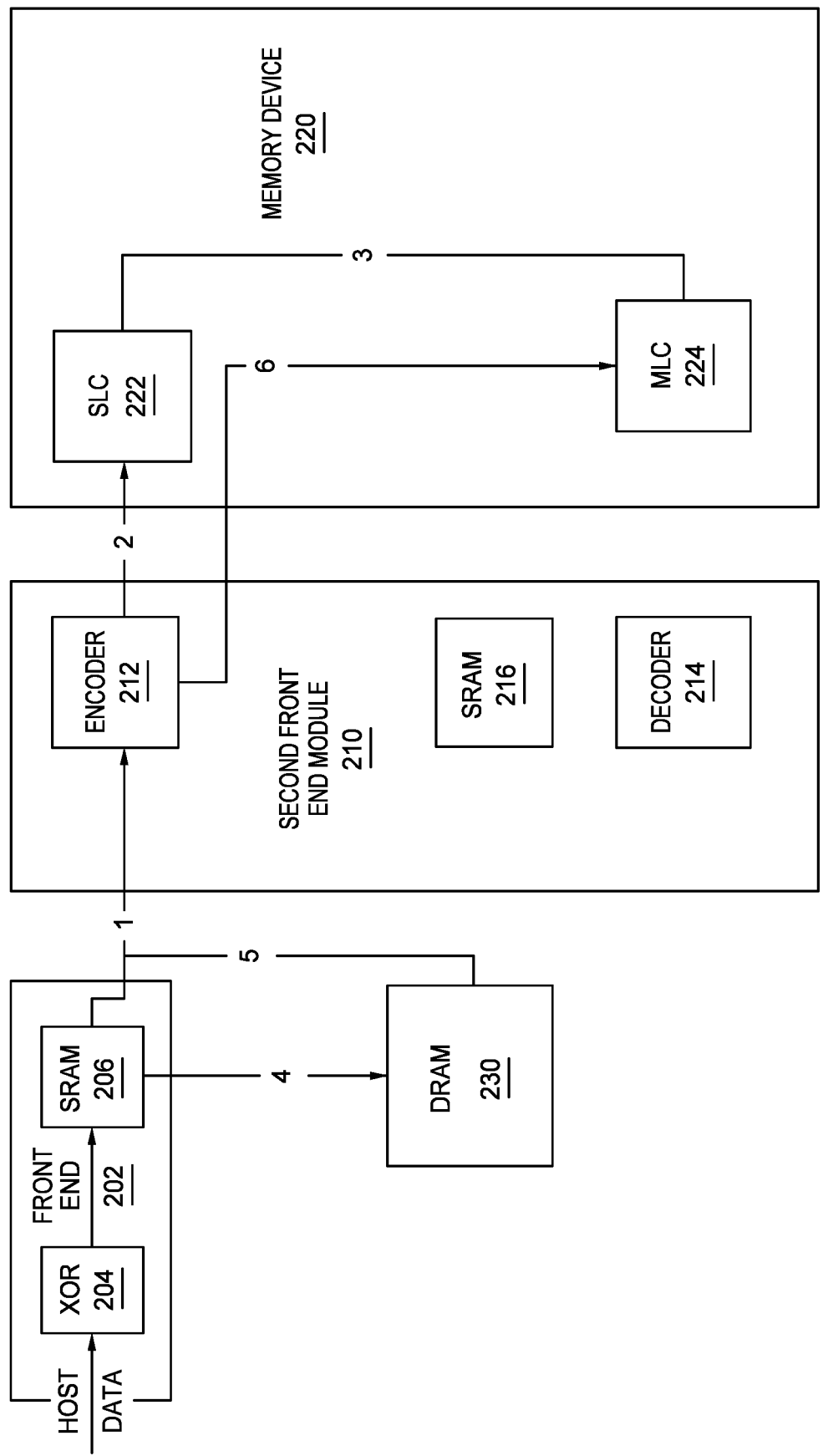

FIGS. 2A-2C are schematic illustrations of scheduling foggy-fine programming according to various embodiments. The Front End (FE) module 202 comprises an XOR engine 204 and a static random-access memory (SRAM) 206. Host data may be initially delivered to the FE module 202. The data passes through the XOR engine 204 and is written to the SRAM 206. The XOR engine 204 generates XOR parity information prior to writing to SRAM 206. Exclusive OR (XOR) parity information is used to improve reliability of storage device for storing data, such as enabling data recovery of failed writes or failed reads of data to and from NVM or enabling data recovery in case of power loss. The storage device may be the data storage device 104 of FIG. 1. The reliability may be provided by using XOR parity information generated or computed based on data stored to storage device. The XOR engine 204 may generate a parity stream to be written to SRAM 206. SRAM 206 may contain a plurality of dies in which data may be written to.

The Second Flash Manager (FM2) module 210 comprises of an encoder 212, a SRAM 216, and a decoder 214. The decoder 214 may comprise a low gear (LG) decoder and a high gear (HG) decoder. The LG decoder can implement low power bit flipping algorithms, such as a low density parity check (LDPC) algorithm. The LG decoder may be operable to decode data and correct bit flips where such data has a low bit error rate (BER). The HG decoder can implement full power decoding and error correction algorithms, which may be initiated upon a failure of the LG decoder to decode and correct bit flips in data. The HG decoder can be operable to correct bit flips where such data has a high BER. Alternatively, FM2 may be replaced with a combined FE-FM monochip.

The encoder 212 and decoder 214 (including the LG decoder and HG decoder) can include processing circuitry or a processor (with a computer-readable medium that stores computer-readable program code (e.g., firmware) executable by the processor), logic circuitry, an application specific integrated circuit (ASIC), a programmable logic controller, an embedded microcontroller, a combination thereof, or the like, for example. In some examples, the encoder 212 and the decoder 214 are separate from the storage controller, and in other examples, the encoder 212 and the decoder 214 are embedded in or part of the storage controller. In some examples, the LG decoder is a hardened circuit, such as logic circuitry, an ASIC, or the like. In some examples, the HG decoder can be a soft decoder (e.g., implemented by a processor). Data may be written to SRAM 216 after being decoded at the decoder 214. The data at SRAM 216 may be further delivered to the encoder 212, as discussed below.

The memory device may be a NAND memory device. The memory device 220 may comprise of a SLC 222 and a MLC 224. It is to be understood that the embodiments discussed herein are applicable to any multilevel cell such as MLC, TLC or QLC. MLC is simply exemplified. SLC 222, MLC, TLC, QLC, and PLC are named according to the number of bits that a memory cell may accept. For example, SLC may accept one bit per memory cell and QLC may accept four bits per memory cell. Each bit is registered on the storage device as a 1 or a 0. Additionally, while SLC memory is exemplified as a memory device, it is also contemplated that the SLC memory may be replaced with a 2-bit cell or MLC memory device.

FIG. 2A is a schematic illustration of a foggy-fine writing process, according to one embodiment. Host data is fed to the FE module 202. The host data is sent through the XOR engine 204, and XOR parity information is generated. The data is then written to the SRAM 206 at the FE module 202. At the FM2 module 210, data is delivered to the encoder 212 from the SRAM 206 along stream 1. The data is then written to the SLC 222 of the memory device 220 along stream 2. To proceed with the foggy-fine writing to the MLC 224, the data is read from SLC 222 and then decoded at the decoder 214 of the FM2 module 210 along stream 3. The decoded data is then written to the SRAM 216 of the FM2 module 210 in steam 4. The data is then send through the encoded 212 along stream 5 for encoding. The foggy write occurs after the data that is encoded at the encoder 212 of the FM2 module 210 from the SRAM 216 of the FM2 module 210 along stream 6. The foggy write is the initial write from encoder 212 of the FM2 module 210 to the MLC 224 of the memory device 220. To proceed with the fine write, data is then read from SLC 222 and delivered to the decoded 214 along stream 7. Following decoding, the data is then written in SRAM along stream 8 and then delivered to the encoder 212 along stream 9 for encoding. The now encoded data is then fine written to MLC 224 along stream 10.

According to the embodiment referred to in FIG. 2A, there may be no DRAM-bus traffic. Furthermore, the SLC and MLC programming may be de-coupled. The foggy-fine writing process may incorporate multi-stream with direct write hot/cold sorting support. However, the bus traffic may be higher.

FIG. 2B is a schematic illustration of a foggy-fine writing process, according to another embodiment. Host data is delivered to the FE module 202. The host data passes through the XOR engine 204 and XOR parity information is generated. The data is then written to the SRAM 206 at the FE module 202. From the SRAM 206 at the FE module, the data is then transferred to the encoder 212 along stream 1. Once the data is encoded, the data is written to the SLC 222 along steam 2. Simultaneous with transferring the data to the encoder 212 along stream 1, the data is transferred to the DRAM 230 along stream 3. The foggy-fine writing process involves first sending the data written to the DRAM 230 and then to the encoder 212 along stream 4 for encoding. The encoded data is then foggy written to MLC along stream 5. Thereafter, the data is again set from DRAM 230 to the encoder 212 along stream 6 for encoding. Following encoding the data is then fine written along stream 7 to MLC 224. The foggy write step transfers the data from the DRAM 230 to the encoder 212 and writes the data to the MLC 224. The fine write step occurs after the foggy write step. The fine write step transfers the data from the DRAM 230 to the encoder 212 and writes the data to the MLC 224. The SLC and MLC programs may occur in a sequential write process due to buffer limitations.

FIG. 2C is a schematic illustration of a foggy-fine writing process, according to another embodiment. Host data is delivered to the FE module 202. The host data passes through the XOR engine 204 and XOR parity information is generated. The data is then written to the SRAM 206 at the FE module 202. From the SRAM 206 at the FE module, the data is then transferred to the encoder 212 along stream 1 and then written to the SLC 222 along stream 2. The foggy write step writes the data from SLC 222 to MLC 224. More specifically, the data is read from SLC 222 and then foggy written to MLC 224 along stream 3. Concurrently with sending the data to the encoder 212, the data is transferred to the DRAM 230 from SRAM 206 at the FE module 202 along stream 4. The fine write step involves sending the data from DRAM 230 to the encoder 212 along stream 5, along with XOR data, and then foggy writing the encoded data to MLC 224 along stream 6. The data path using NAND data latches to stage data between SLC and foggy programs, so that single 4-page data transfer may be used for SLC and foggy MLC programs. The fine write may also occur from SLC 222 to MLC 224 after the foggy write in the case that the original fine write becomes corrupted. The SLC and MLC programing may occur in a sequential write process due to buffer limitations.

FIG. 3 is a chart illustrating staggering foggy-fine programming. It is to be understood that the disclosure is not limited to the staggered foggy-fine programming exemplified in FIG. 3, but rather, other sequences are contemplated as well. More specifically, to perform foggy-fine programming, foggy programming along a word line for a particular string cannot occur back-to-back. As shown in FIG. 3, to properly foggy-fine write to word line 0 at string 0, several additional writes need to occur between the foggy write to word line 0, string 0 and the fine write to word line 0, string 0. The foggy-fine write process proceeds as follows.

Initially, data is foggy written to word line 0, string 0. Then, data is foggy written to word line 0, string 1. Thereafter, data is foggy written to word line 0, string 2. Then, data is foggy written to word line 0, string 3. Thereafter, data is foggy written to word line 1, string 0. Now, finally, data can be fine written to word line 0, string 0. The arrows in FIG. 3 illustrate the path of writing in the foggy-fine writing process. Basically, to properly foggy-fine write data, data is initially foggy written to the specifically data location. Then, three additional foggy data writes occur to the same word line, but at different strings. A fourth foggy write occurs in an adjacent word line along the same string of the specific data location. Only after the fourth foggy write to the adjacent word line and same string may the fine writing to the original word line and original string (i.e., the original data location) be performed. In total, four additional foggy writes occur prior to the fine writing.

Figure 4A:
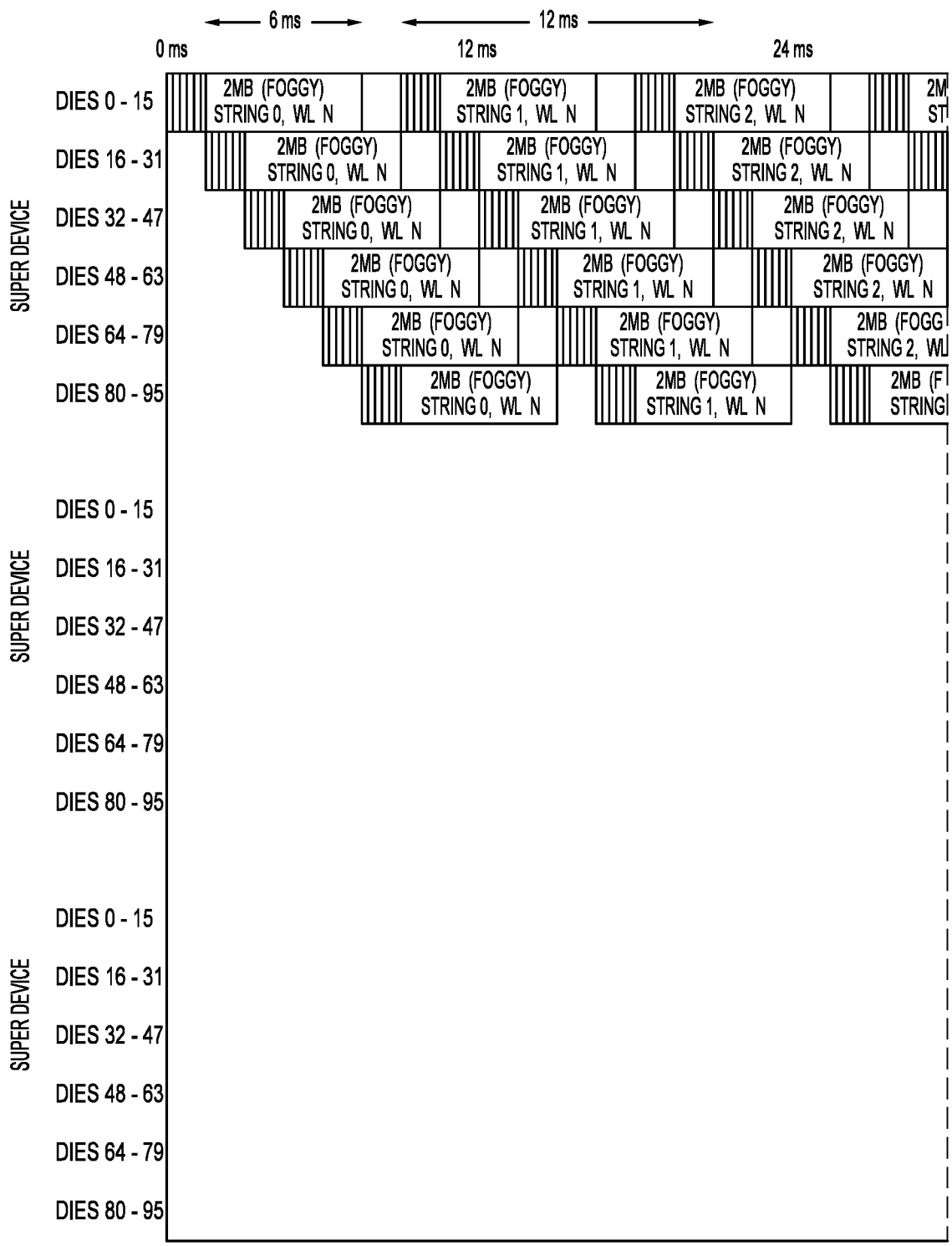
FIGS. 4A-4C are collectively a schematic illustration showing a programming ratio of SLC:foggy:fine according to one embodiment.
Figure 4B:
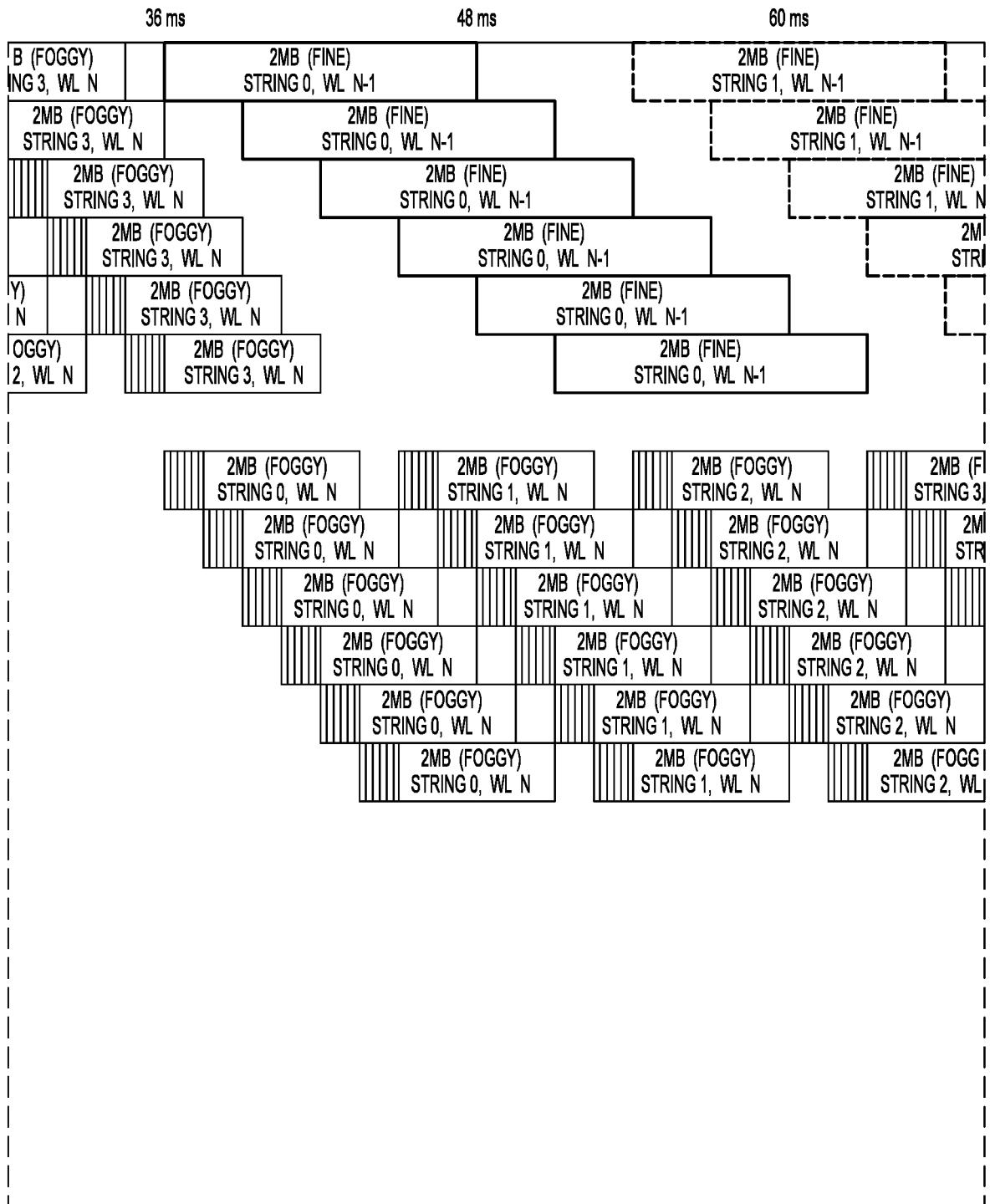
Figure 4C:
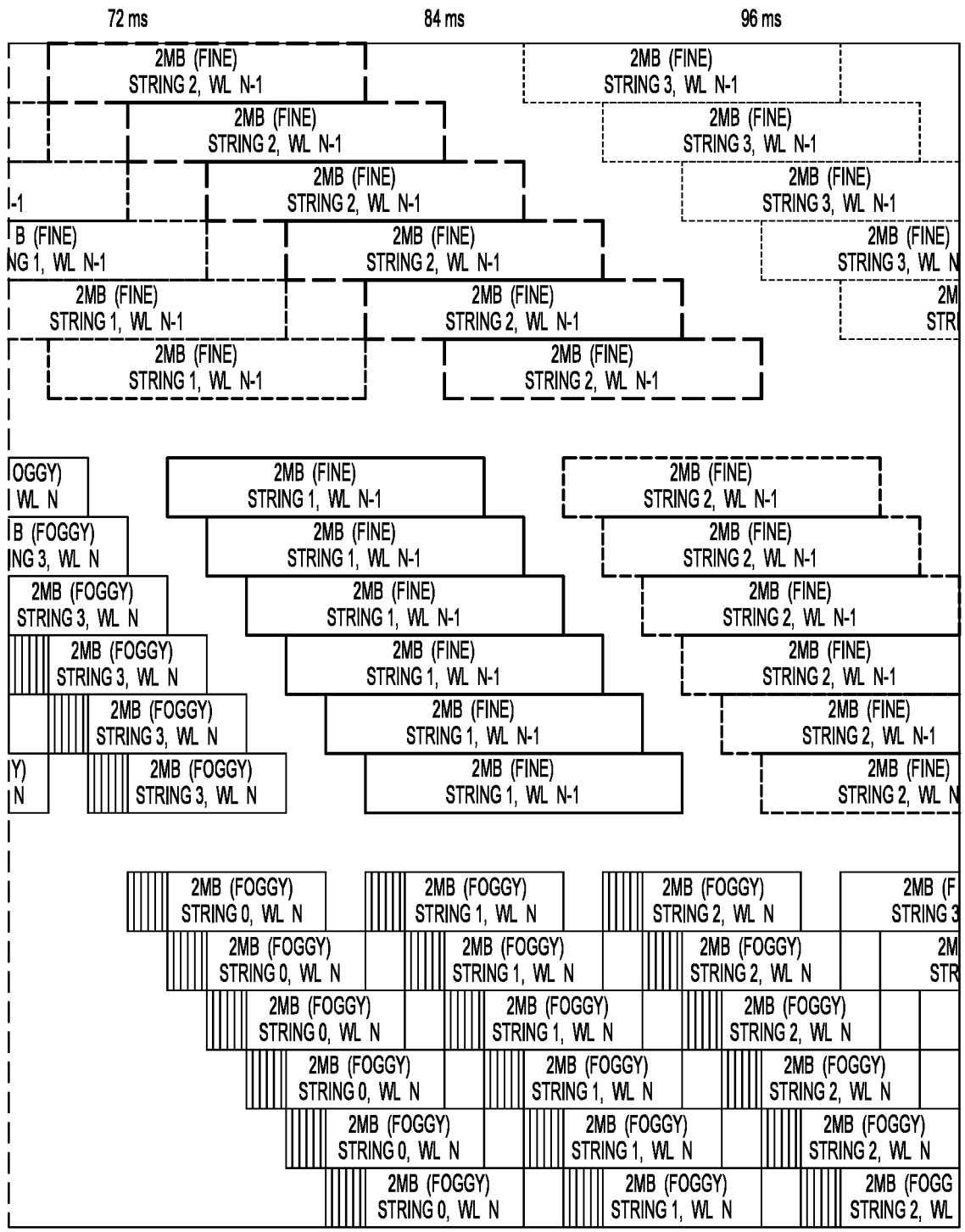

FIGS. 4A-4C are collectively a schematic illustration showing a programming ratio of SLC:foggy:fine according to one embodiment. In general, SLC programming is significantly faster than foggy and fine MLC (or TLC or QLC) programs (i.e., about 10× difference). By staggering writing to the drive (e.g., utilizing single 4-page data transfer), the overall transfers may be more consistent with little to no performance loss and without throttling the data transfer (e.g., slowing down the host transfers to artificially make the drive have a more consistent performance). The ratio of (x)SLC:(y)foggy:(z)fine programs should generally be as close as possible to $4*tPROG_{SLC}:tPROG_{Foggy}:tPROG_{Fine}$, where the value 4 reflects the 1:4 density difference between SLC and QLC. This principle may be applied to a different mix of NAND modes, such as MLC and TLC.

FIGS. 4A-4C show the staggering principle in a drive with three active super-devices comprising of 96-die each. Within each super-device, data may be written to the various word lines, strings, and foggy/fine programming that may resemble the process outlined in FIG. 3. Furthermore, for every four writes (i.e., 4-page data transfer) to SLC (denoted by the small vertical bars associated adjacent the foggy writes), there is one foggy write to QLC or one fine write to QLC. To ensure smooth 2 GB/s write performance, 2 MB of SLC data should be written every 1.5 ms.

Figure 5A:
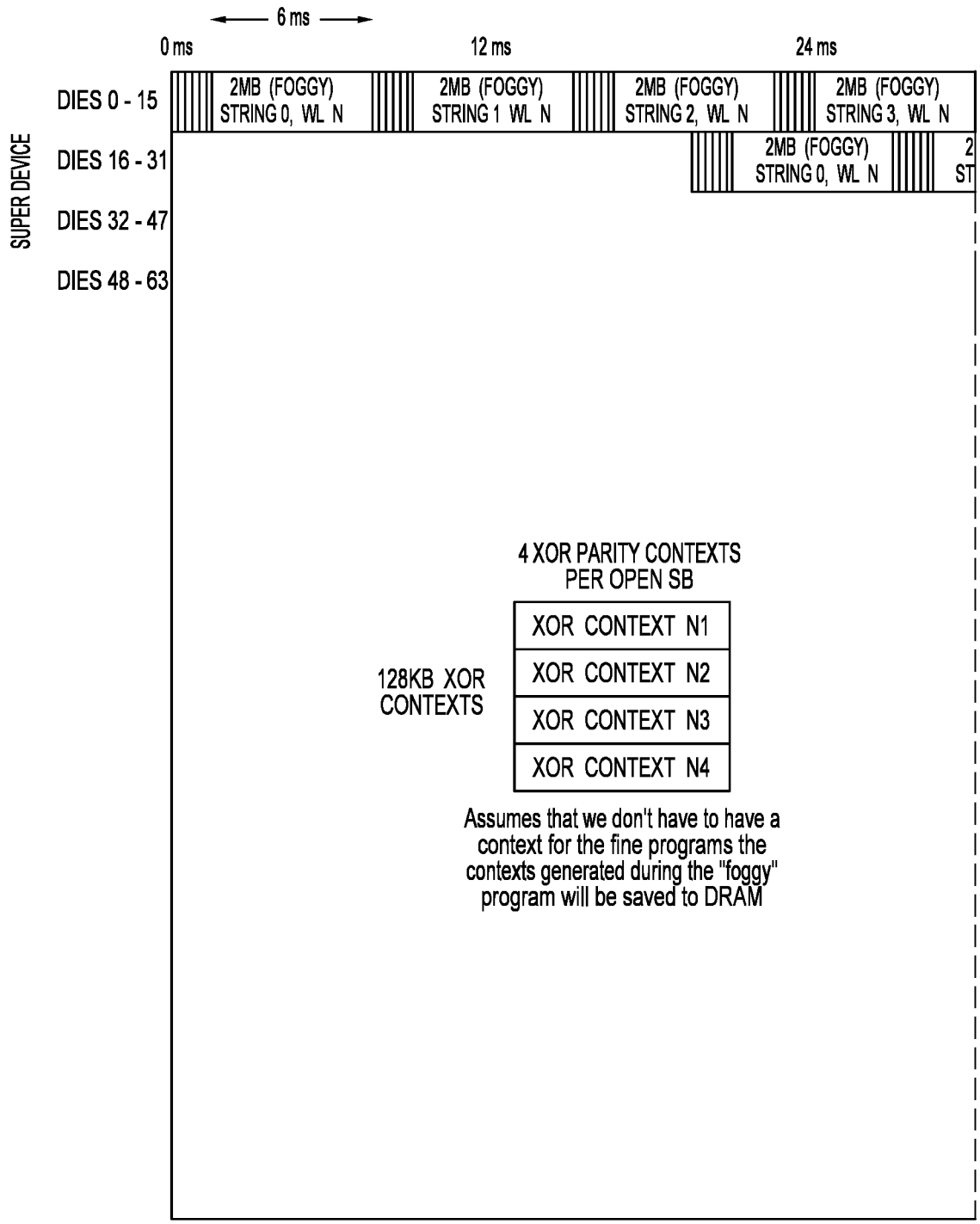
FIGS. 5A-5C are collectively a schematic illustration showing foggy-fine programming for a single super-device.
Figure 5B:
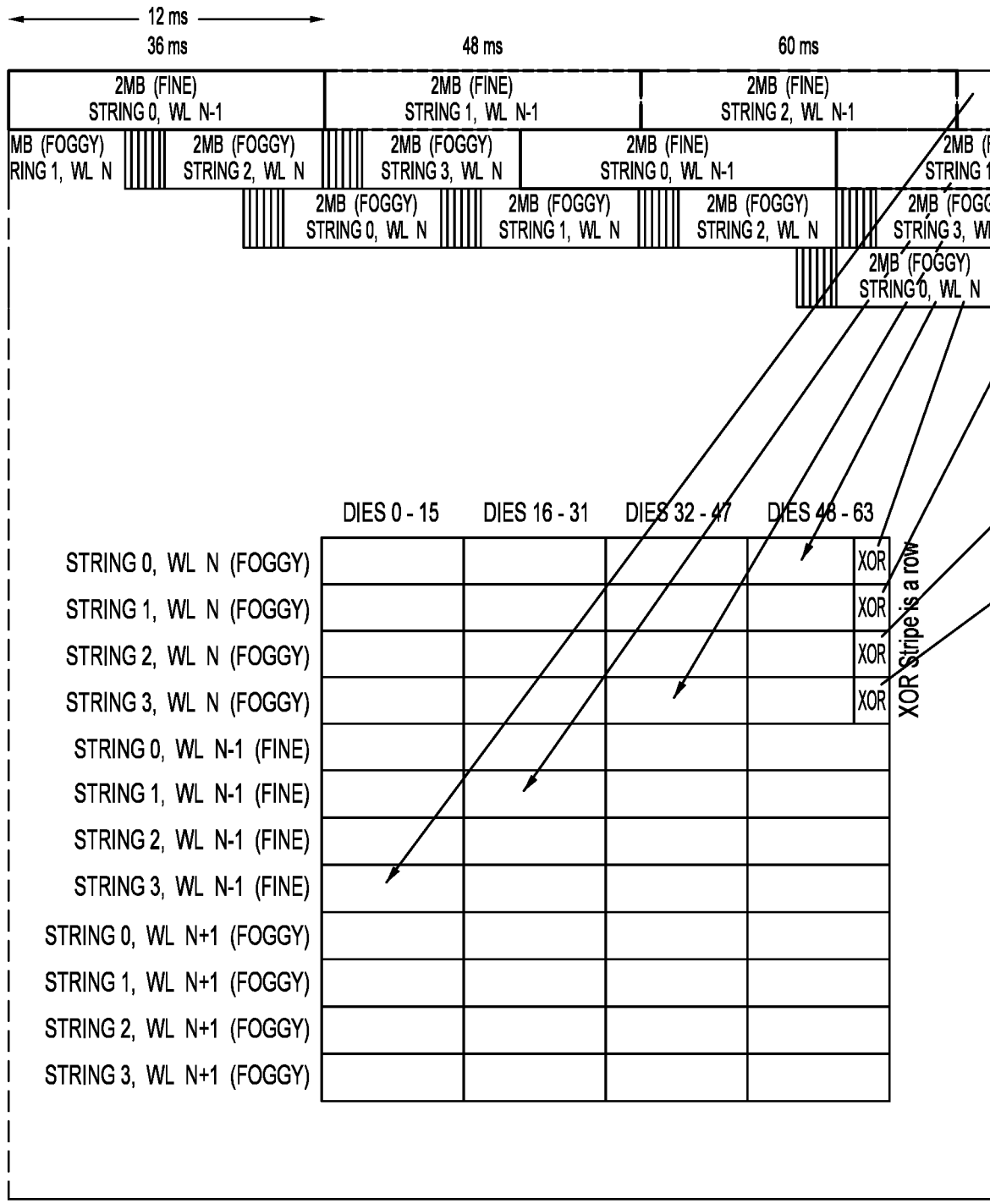
Figure 5C:
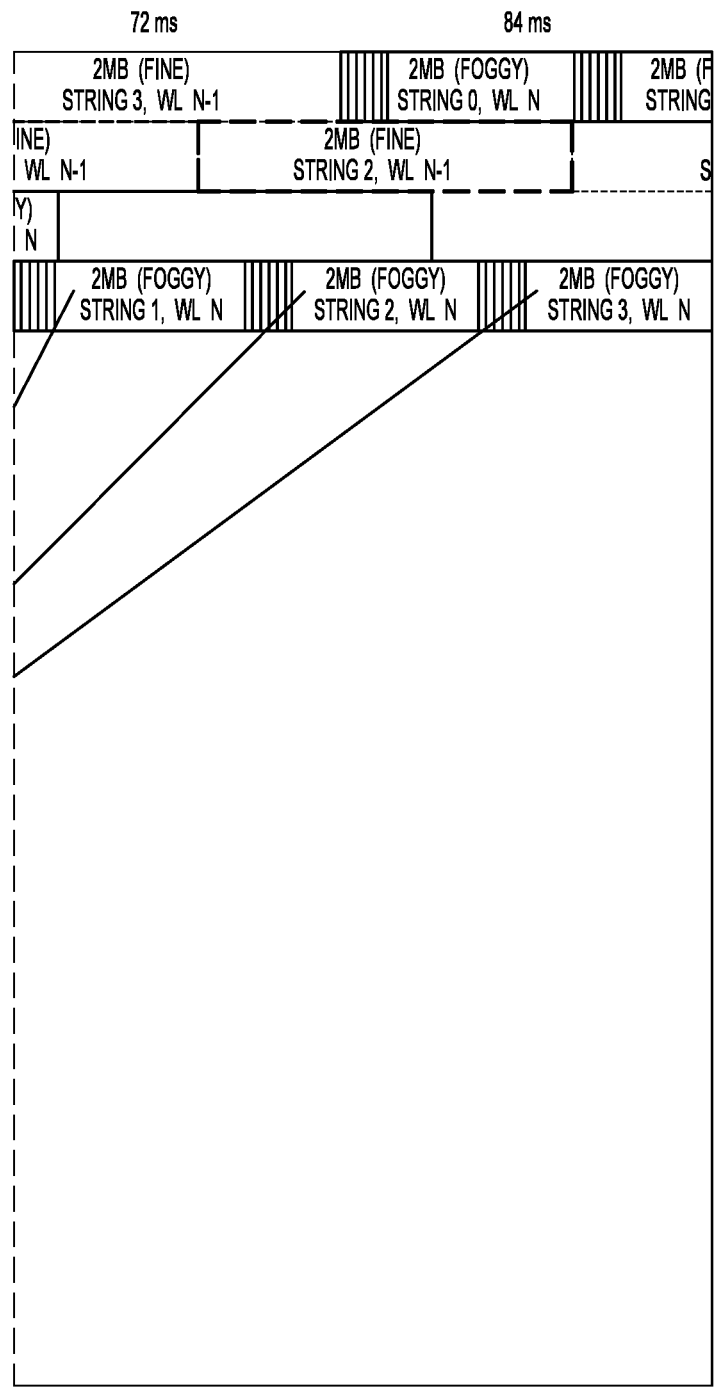

FIGS. 5A-5C are collectively a schematic illustration showing foggy-fine programming for a single super-device. For each word line, 128 KB of XOR context may be generated for each foggy program, and written to DRAM. FIG. 5 demonstrates the principle of sharing a limited number of parity contexts to achieve the staggered scheduling of different program types in a super-device. The limited number of parity contexts refers to the value of 4, which is the 1:4 density difference between SLC and QLC. Each parity group refers to a super-WL, which is a unit of all data in the same WL-string in all devices. FIG. 5 may refer to the method in FIG. 3 to demonstrate the method for SLC/foggy-fine programming to a super-device. After a string in a word line is at capacity, the XOR data is generated by the XOR engine, and the XOR engine is then available for generating XOR parity data for the next completed word line. Similar to FIG. 4, the staggering of the SLC-foggy-fine writing, and the proportions of 4:1:1 for writing, results in the four XOR generators being sufficient to provide the needed parity data by staggering the availability of the XOR generators.

Figure 6A:
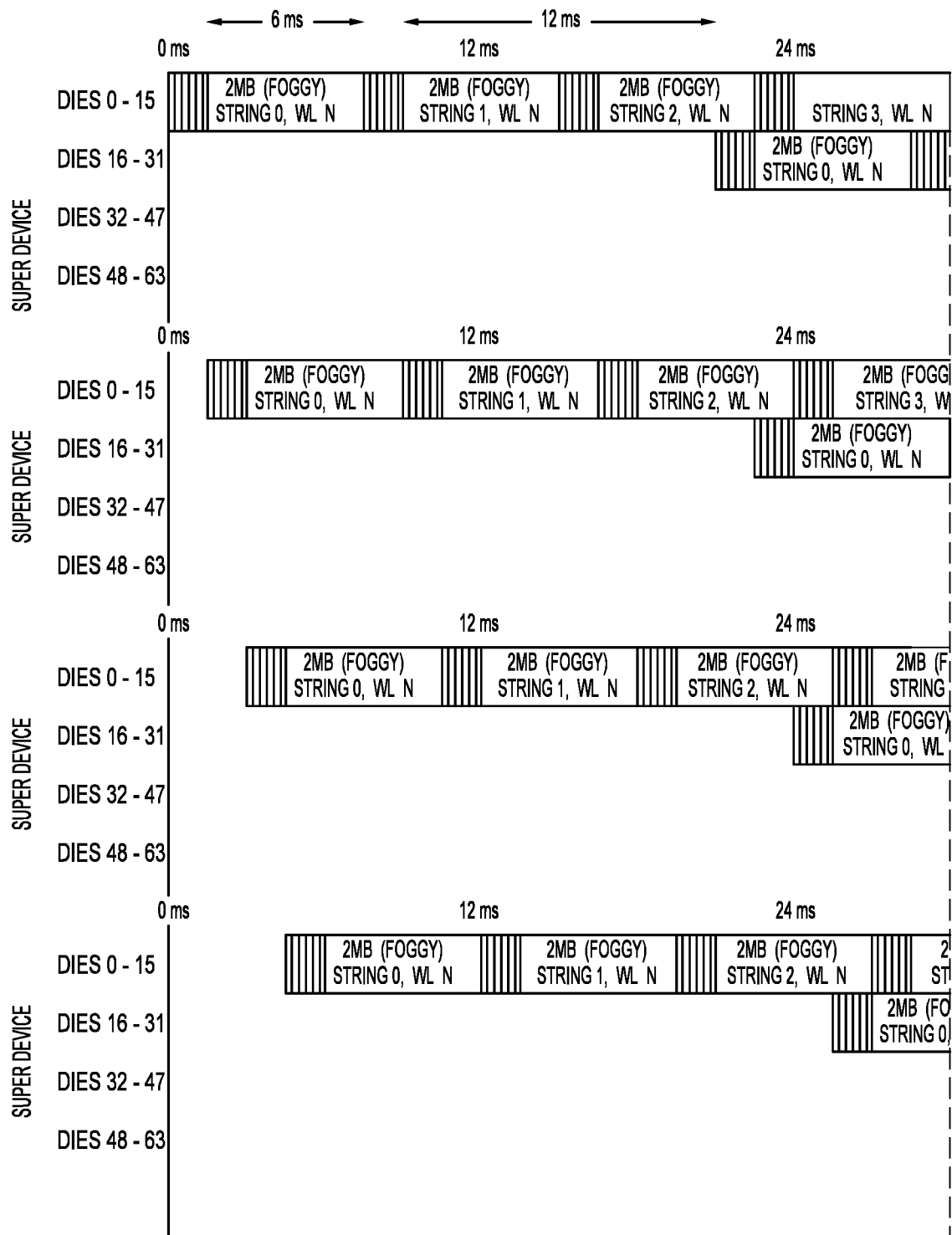
FIGS. 6A-6C are collectively a schematic illustration showing foggy-fine programming for multiple super-devices.
Figure 6B:
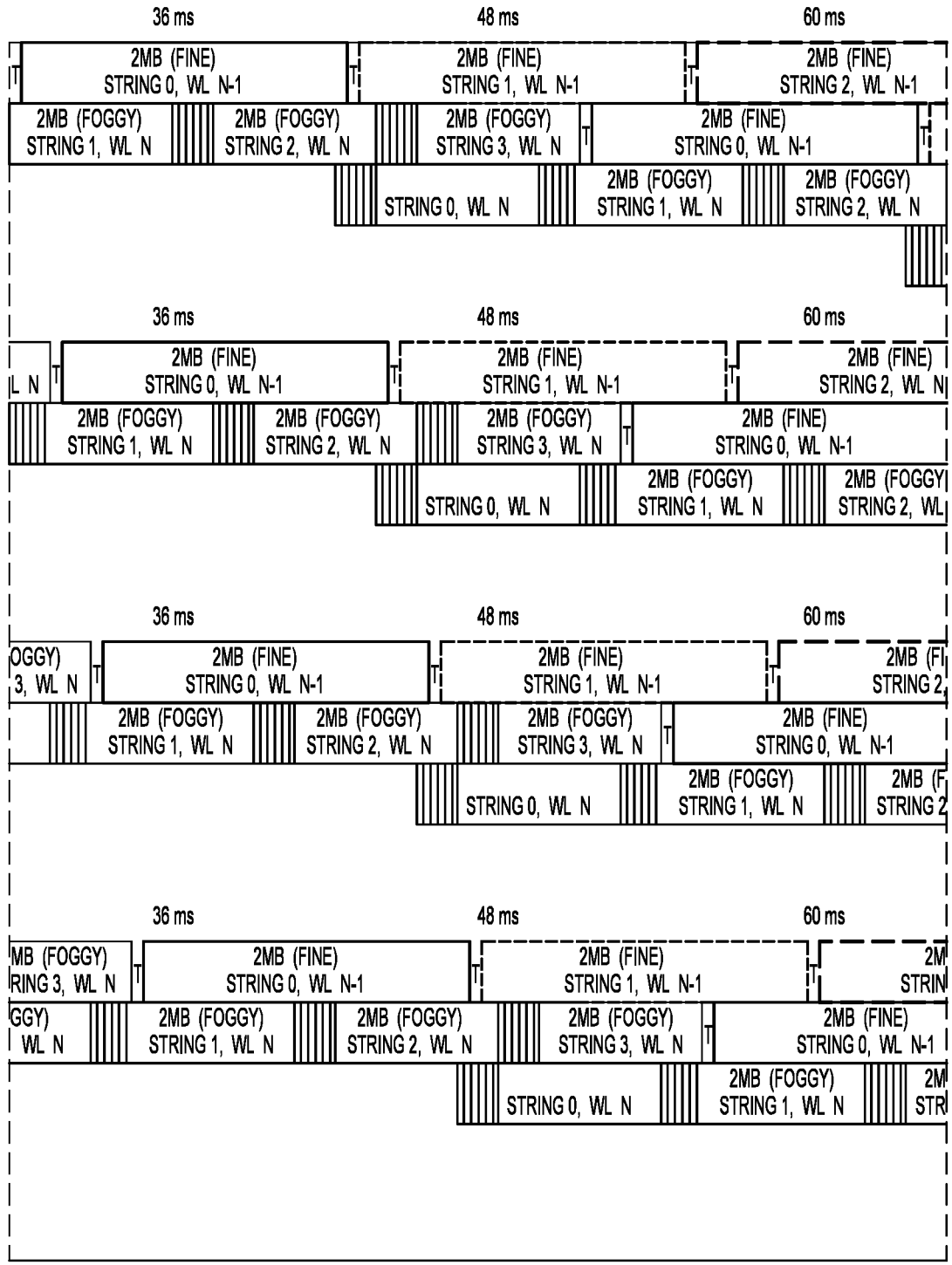
Figure 6C:
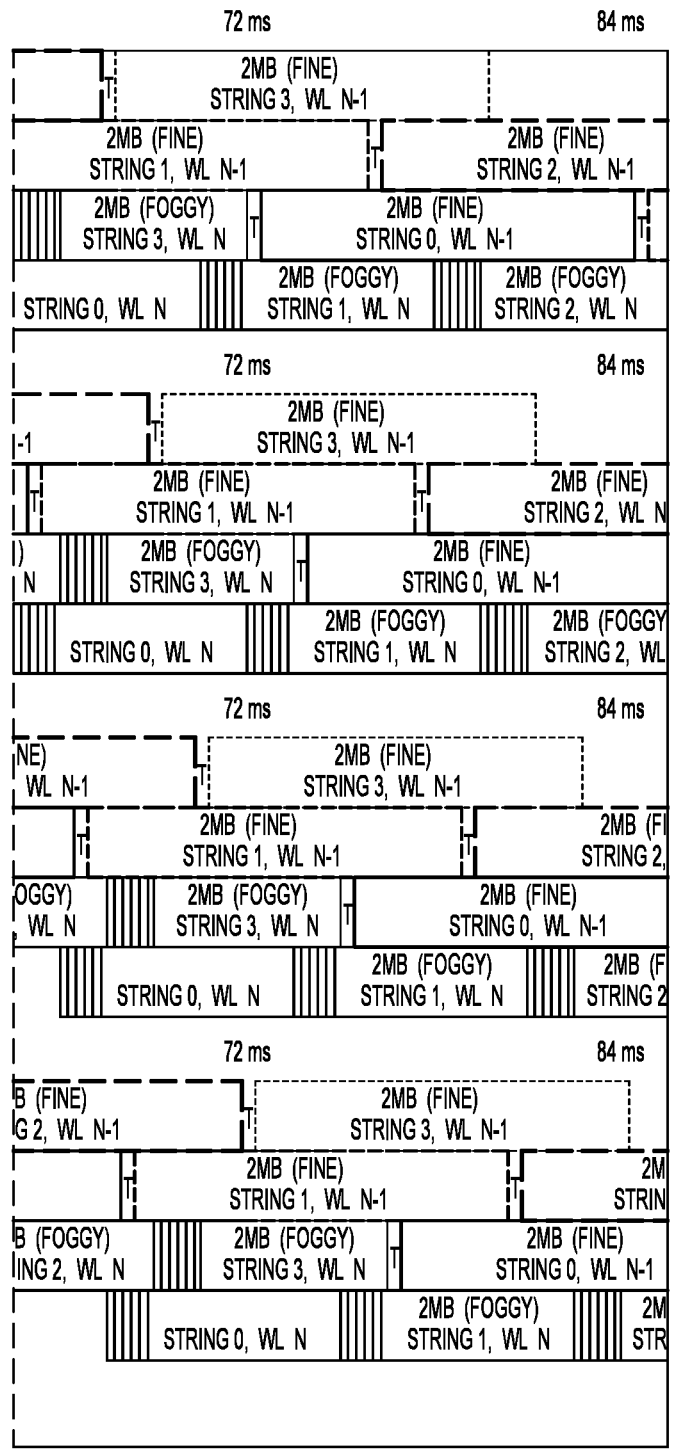

FIGS. 6A-6C are collectively a schematic illustration showing foggy-fine programming for multiple super-devices. The XOR context generated from each foggy program is unique to its own super device (i.e., there is no XOR relationship between super devices). A minimum time gap may be required before starting a SLC/foggy write sequence on String 0 (i.e., the initial write). The time gap may cause the host-write performance to be more consistent. However, the minimum time gap may depend on the drive capacity. Furthermore, to ensure a smooth performance, SLC programs on the dies should not overlap within a super-device. To ensure smooth 2 GB/s write performance, 2 MB of SLC data should be written every 1.5 ms. An overlap of SLC programs may cause a performance bottleneck. Priority for data write is given to a WL that has already been utilized so that SLC writes may not overlap.

Fine data transfer occurs between about 400 µs to about 500 µs (with a 400 MT/s TM bus). Furthermore, there may be one fine data transfer for each 2 MB of SLC transfer/programming. The QLC fine data writes may not overlap. In order to determine which fine data transfer occurs prior to the other, the string number may be used. In general, the lower string number will be transferred prior to the higher string number. In between QLC fine data transfers, a SLC write may occur in order to maintain a more consistent host performance.

The 4 page transfer limitation refers to the 4 XOR contexts that a single super-device may require. In general, the next set of SLC/foggy dies to program are determined by round-robin. Overall, the SLC write, foggy write, and fine write outlined in the embodiment may significantly reduce data transfers over the NAND-bus and DRAM-bus. The reduced data transfers may improve host write performance and may reduce device power consumption.

In one embodiment, data storage device comprises: one or more memory devices, the one or more memory devices including SLC memory and MLC memory; and a controller coupled to the one or more memory devices, the controller configured to: write data to the SLC memory; foggy write the data to MLC memory, wherein the foggy writing the data to the MLC memory includes retrieving the data from latches in the one or more memory devices and writing the retrieved data to the MLC memory; and fine writing the data to the MLC memory. The data that is finely written to the MLC memory does not pass through the SLC memory. The data that is finely written to the MLC memory passes through DRAM and an encoder before being finely written in the MLC memory. The data written to the SLC memory passes through an encoder. The data that is written to the SLC memory does not pass through the DRAM that the data finely written to the MLC memory passes through. The data that is foggy written to the MLC memory does not pass through the DRAM that the data finely written to the MLC memory passes through. A single four page transfer is used for both the writing the data to the SLC memory and foggy writing the data to the MLC memory.

In another embodiment, a data storage device comprises: one or more memory devices, the one or more memory devices each including a plurality of dies with each die including SLC memory and MLC memory; and a controller coupled to the one or more memory devices, the controller configured to: stagger writing to the SLC memory, foggy writing to the MLC memory, and fine writing to the MLC memory, wherein a ratio of writing to the SLC memory to foggy writing to the MLC memory to fine writing to the MLC memory is 4:1:1. Writing to the SLC memory occurs on only one word line at a time for a given memory device of the one or more memory devices. Foggy writing to the MLC memory occurs with for multiple word lines simultaneously. Simultaneous foggy writing occurs for different dies. The simultaneous foggy writing occurs for the same string. The MLC memory is QLC memory. The controller is configured to write data to the SLC memory of at least a first memory device of the one or more memory devices simultaneous with foggy writing data to the MLC memory of a second memory device of the one or more memory devices and simultaneous with fine writing data to the MLC memory of at least a third memory device of the one or more memory devices.

In another embodiment, a data storage device comprises: one or more memory devices, wherein each memory device has a plurality of dies, wherein the plurality of dies are arranged into four strings, wherein the one or more memory devices each include SLC memory and MLC memory; a controller coupled to the one or more memory devices, the controller configured to: write data to the SLC memory of a first string on a first word line for a first set of dies; foggy write data to the MLC memory of the first string on the first word line for the first set of dies; write data to the SLC memory of a second string on the first word line for the first set of dies; foggy write data to the MLC memory of the second string on the first word line for the first set of dies; write data to the SLC memory of a third string on the first word line for the first set of dies; foggy write data to the MLC memory of the third string on the first word line for the first set of dies; write data to the SLC memory of the first string on the first word line for a second set of dies different from the first set of dies; foggy write data to the MLC memory of the first string on the first word line for the second set of dies; write data to the SLC memory of a fourth string on the first word line for the first set of dies; and foggy write data to the MLC memory of the fourth string on the first word line for the first set of dies. The writing data to the SLC memory of the first string on teh first word line for the second set of dies occurs simultaneous with the foggy writing data to the MLC memory of the third string on the first word line for the first set of dies. The controller is further configured to: write data to the SLC memory of the second string on the first word line for the second set of dies; foggy write data to the MLC memory of the second string on the first word line for the second set of dies; and fine write data to the MLC memory of the first string of a different word line from the first word line and the second word line for the first set of dies. The one or more memory devices each have four XOR parity contexts. The one or more memory devices comprises two memory devices and wherein writing to SLC memory is staggered across the two memory devices. There is a time gap between starting an SLC writing on a string in a first memory device of the two memory devices and a string in a second memory device of the two memory devices.

By foggy writing data in MLC that has been stored in latches in the memory device, improved foggy-fine programming occurs. Additionally, by programming in a staggered fashion at a ratio of 4:1:1, efficient XOR context management occurs.

While the foregoing is directed to embodiments of the present disclosure, other and further embodiments of the disclosure may be devised without departing from the basic scope thereof, and the scope thereof is determined by the claims that follow.

What is claimed is:

1. A data storage device, comprising:
   one or more memory devices, the one or more memory devices including SLC memory and MLC memory; and
   a controller coupled to the one or more memory devices, the controller configured to:
      write data to the SLC memory;
      foggy write the data to MLC memory, wherein the foggy writing the data to the MLC memory includes:
         retrieving the data from the SLC memory; and
         writing the retrieved data to the MLC memory; and
      fine writing the data to the MLC memory.

2. The data storage device of claim 1, wherein the data that is finely written to the MLC memory does not pass through the SLC memory.

3. The data storage device of claim 2, wherein the data that is finely written to the MLC memory passes through DRAM and an encoder before being finely written in the MLC memory.

4. The data storage device of claim 3, wherein the data written to the SLC memory passes through an encoder.

5. The data storage device of claim 4, wherein the data that is written to the SLC memory does not pass through the DRAM that the data finely written to the MLC memory passes through.

6. The data storage device of claim 5, wherein the data that is foggy written to the MLC memory does not pass through the DRAM that the data finely written to the MLC memory passes through.

7. The data storage device of claim 1, wherein a single four page transfer is used for both the writing the data to the SLC memory and foggy writing the data to the MLC memory.

8. A data storage device, comprising:
   one or more memory devices, the one or more memory devices each including a plurality of dies with each die including SLC memory and MLC memory; and
   a controller coupled to the one or more memory devices, the controller configured to:
      stagger writing to the SLC memory, foggy writing to the MLC memory, and fine writing to the MLC memory, wherein a ratio of writing to the SLC memory to foggy writing to the MLC memory to fine writing to the MLC memory is 4:1:1.

9. The data storage device of claim 8, wherein writing to the SLC memory occurs on only one word line at a time for a given memory device of the one or more memory devices.

10. The data storage device of claim 8, wherein foggy writing to the MLC memory occurs with for multiple word lines simultaneously.

11. The data storage device of claim 10, wherein simultaneous foggy writing occurs for different dies.

12. The data storage device of claim 11, wherein the simultaneous foggy writing occurs for the same string.

13. The data storage device of claim 12, wherein the MLC memory is QLC memory.

14. The data storage device of claim 8, wherein the controller is configured to write data to the SLC memory of at least a first memory device of the one or more memory devices simultaneous with foggy writing data to the MLC memory of a second memory device of the one or more memory devices and simultaneous with fine writing data to the MLC memory of at least a third memory device of the one or more memory devices.

15. A data storage device, comprising:
one or more memory devices, wherein each memory device has a plurality of dies, wherein the plurality of dies are arranged into four strings, wherein the one or more memory devices each include SLC memory and MLC memory;
a controller coupled to the one or more memory devices, the controller configured to:
write data to the SLC memory of a first string on a first word line for a first set of dies;
foggy write data to the MLC memory of the first string on the first word line for the first set of dies;
write data to the SLC memory of a second string on the first word line for the first set of dies;
foggy write data to the MLC memory of the second string on the first word line for the first set of dies;
write data to the SLC memory of a third string on the first word line for the first set of dies;
foggy write data to the MLC memory of the third string on the first word line for the first set of dies;
write data to the SLC memory of the first string on the first word line for a second set of dies different from the first set of dies;
foggy write data to the MLC memory of the first string on the first word line for the second set of dies;
write data to the SLC memory of a fourth string on the first word line for the first set of dies; and
foggy write data to the MLC memory of the fourth string on the first word line for the first set of dies.

16. The data storage device of claim 15, wherein the writing data to the SLC memory of the first string on the first word line for the second set of dies occurs simultaneous with the foggy writing data to the MLC memory of the third string on the first word line for the first set of dies.

17. The data storage device of claim 15, wherein the controller is further configured to:
write data to the SLC memory of the second string on the first word line for the second set of dies;
foggy write data to the MLC memory of the second string on the first word line for the second set of dies; and
fine write data to the MLC memory of the first string of a different word line from the first word line and the second word line for the first set of dies.

18. The data storage device of claim 15, wherein the one or more memory devices each have four XOR parity contexts.

19. The data storage device of claim 15, wherein the one or more memory devices comprises two memory devices and wherein writing to SLC memory is staggered across the two memory devices.

20. The data storage device of claim 19, where there is a time gap between starting an SLC writing on a string in a first memory device of the two memory devices and a string in a second memory device of the two memory devices.

* * * * *